(12) United States Patent
Lerner et al.

(10) Patent No.: US 9,069,689 B2
(45) Date of Patent: Jun. 30, 2015

(54) DOWNSAMPLING WITH PARTIAL-SUM RE-USE

(75) Inventors: Boris Lerner, Sharon, MA (US); Gopal Gudhur Karanam, Bangalore (IN)

(73) Assignee: ANALOG DEVICES, INC., Norwood, MA (US)

(*) Notice: Subject to any disclaimer, the term of this patent is extended or adjusted under 35 U.S.C. 154(b) by 357 days.

(21) Appl. No.: 13/489,605

(22) Filed: Jun. 6, 2012

(65) Prior Publication Data

US 2013/0332495 A1  Dec. 12, 2013

(51) Int. Cl.
*H03H 17/06* (2006.01)
*H03H 17/02* (2006.01)
*G06F 17/10* (2006.01)

(52) U.S. Cl.
CPC ............. *G06F 17/10* (2013.01); *H03H 17/026* (2013.01); *H03H 17/0621* (2013.01)

(58) Field of Classification Search
CPC ....... G06F 17/18; G06F 17/11; H03H 17/026; H03H 17/0664; H03H 17/0621
USPC .................................................. 708/313, 445
See application file for complete search history.

(56) References Cited

U.S. PATENT DOCUMENTS

| | | | |
|---|---|---|---|
| 4,322,697 A | 3/1982 | Carbrey | |
| 6,389,441 B1 * | 5/2002 | Archer et al. | 708/445 |
| 6,532,441 B1 * | 3/2003 | Urso | 708/313 |
| 6,778,599 B1 | 8/2004 | Doron | |
| 6,826,584 B1 * | 11/2004 | Carrig et al. | 708/400 |
| 7,336,208 B2 | 2/2008 | Van Den Enden et al. | |
| 7,765,251 B2 * | 7/2010 | Xu et al. | 708/445 |
| 2010/0091829 A1 | 4/2010 | Schwoerer et al. | |
| 2011/0143689 A1 | 6/2011 | Ballantyne et al. | |
| 2011/0317773 A1 | 12/2011 | Lancaster | |
| 2012/0236187 A1 | 9/2012 | Guthrie et al. | |
| 2012/0246210 A1 | 9/2012 | Pan et al. | |
| 2013/0197865 A1 | 8/2013 | Reich | |
| 2013/0230093 A1 | 9/2013 | Aziz et al. | |
| 2014/0101218 A1 | 4/2014 | Tinker | |
| 2014/0169512 A1 | 6/2014 | Park et al. | |
| 2015/0015586 A1 | 1/2015 | Messmer et al. | |

FOREIGN PATENT DOCUMENTS

KR   100905153 B1   6/2009
WO   WO-9727695 A2   7/1997

* cited by examiner

*Primary Examiner* — Chuong D Ngo
(74) *Attorney, Agent, or Firm* — Patent Capital Group

(57) ABSTRACT

The sampling rate of a digital signal is reduced by storing a series of partial sums of the digital signal instead of the signal itself, thus reducing the memory size required to perform the sampling-rate reduction.

25 Claims, 5 Drawing Sheets

DOWNSAMPLING WITH PARTIAL-SUM RE-USE

TECHNICAL FIELD

Embodiments of the current invention related to digital-signal processing and, in particular, to anti-aliasing filters.

BACKGROUND

Analog audio or image signals are converted to digital form by "sampling," i.e., repeatedly measuring the signal amplitude over time or over the image; the set of samples thus obtained constitutes a digital approximation of the initial signal and can be used to reproduce the signal. Decimation, or "downsampling," is an operation in digital-signal or -image processing in which a set of samples is reduced in size. For example, a set of 100 samples may be decimated by a factor of two by selecting 50 samples that best represent the analog signal defined by the original 100 samples. The selection may be made by simply selecting every odd (or even) sample or, in more sophisticated operations, by replacing every pair of original samples with their average.

Because decimation reduces the effective sampling rate of the signal, however, care must be taken that the new sampling rate is at least twice the frequency of any components of interest within the original signal (the so-called Nyquist frequency). If the original signal included components with frequencies above the Nyquist frequency, they will be "aliased" and corrupt the components of interest in the sample set. An anti-aliasing filter may be used to remove these high-frequency components; in decimation operations, an averaging filter is commonly used as an anti-aliasing filter. An averaging filter outputs a point y at a location n (i.e., the nth point y), given an input set of points x, by averaging N input points x for each output point y. This operation is expressed formally in Equation (1)

$$y_n = \frac{1}{N} \sum_{k=n}^{n+N-1} x_k \quad (1)$$

For example, if 10 input points x are averaged for each output point y (N=10), then $y_0$ is the average of $x_0$ through $x_9$, $y_1$ is the average of $x_1$ through $x_{10}$, $y_2$ is the average of $x_2$ through $x_{11}$, and so on. The sum needed for each new average may be computed by taking the value of the sum in the last average, subtracting the value of the "oldest" sample, and adding the value of the "newest" sample. For example, to compute the average of $x_1$ through $x_{10}$, the value of $x_0$ is subtracted from the sum of $x_0$ through $x_9$ (which is already computed for the previous average), and the value of $x_{10}$ is added. More formally, the sum of input points x from $x_n$ to $x_m$ is given below in Equation (2).

$$S_{n,m} = \sum_{k=n}^{m} x_k \quad (2)$$

The value of a "next" sum is therefore defined by Equation (3), $$S_{(n+1),(m+1)} = S_{n,m} - x_n + x_{(m+1)} \quad (3)$$

in which the distance between n and m is defined by N, and thus m=n+(N−1). For the sake of illustration, Equation (3) becomes, using the example above, the expression shown below in Equation (4).

$$S_{1,10} = S_{0,9} - x_0 + x_{10} \quad (4)$$

In general, Equation (1) may be re-written as an average of computed sums, as shown below in Equation (5).

$$y_n = \frac{1}{N} S_{n,m} \quad (5)$$

While this approach is attractive because it requires only one additional addition and subtraction operation per sample, it requires that the N−1 previous samples be stored in memory (because, at each new sample, the process must know the value of the "oldest" sample in order to subtract it). This memory requirement becomes even more severe in the case of operations such as raster-order image streaming, which requires the storage of N−1 previous lines of samples. The memory required for such storage may exceed the local storage space available to a processor, requiring the use of slower, system memory. In the worst case, the fetching and retrieval from system memory is too slow to keep up with the incoming data rate, and the filtering process fails. A need therefore exists for a decimation operation that has a lower memory requirement.

SUMMARY

In general, various aspects of the systems and methods described herein reduce the amount of required memory required for downsampling a stream of digital samples. History information about prior input samples is required to compute later output points, but the present invention saves as few as one carefully selected input data point and one partial sum of prior input samples (instead of an entire history of prior input samples). Using only this reduced set of history information, the present invention computes values for down-sampled output data in accordance with a selected decimation rate and filter size.

In one aspect, a method for computationally downsampling digital samples of a signal is disclosed. The method includes identifying a partial sum to use for the downsampling, wherein the partial sum is identified as a sum $S_{n+i,n+N-1}$ of (N−i) samples $x_{n+i}, \ldots x_{n+N-1}$, wherein i is an integer portion of the decimation factor d, computing the partial sum $S_{n+i,n+N-1}$; storing the computed partial sum $S_{n+i,n+N-1}$ in a hardware register; computing a first sum $S_{n,n+N-1}$ of a first set of N digital samples $x_n, \ldots x_{n+N-1}$ as a sum of a set of i digital samples $x_n, \ldots x_{n+i-1}$ and the computed partial sum $S_{n+i,n+N-1}$; computing a second sum $S_{n+i,n+N-1}$ of a second set of N digital samples $x_{n+i}, \ldots x_{n+i+N-1}$ as a sum of a set of i digital samples $x_{n+N}, \ldots x_{n+i+N-1}$ and the computed partial sum $S_{n+i,n+N-1}$; and downsampling the digital samples based at least in part on the first sum $S_{n,n+N-1}$ and the second sum $S_{n+i,n+N-1}$.

The digital sample $x_n$ may be stored in a hardware register. A third sum $S_{n+1,n+N}$ may be computed by subtracting $x_n$ from the first sum $S_{n,n+N-1}$ and by adding another digital sample $x_{n+N}$. N may be 16 and the digital samples may be decimated by a factor of 10.3. The digital samples may correspond to a one- or two-dimensional signal; the two-dimensional signal may correspond to raster-scan image data; partial sums may be stored corresponding to a row of input data.

In another aspect, a system for downsampling digital samples includes an averaging filter having N taps (where N>1). A first memory stores a first digital sample, and a second memory stores a partial sum of two or more digital samples. The averaging filter computes an average of N digital samples using the stored digital sample and the stored partial sum.

An interpolator may used for interpolating between outputs of the averaging filter. The digital samples may correspond to a one- or two-dimensional signal. The two-dimensional signal may correspond to raster-scan image data; partial sums may be stored corresponding to a row of input data.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

Figure 1:
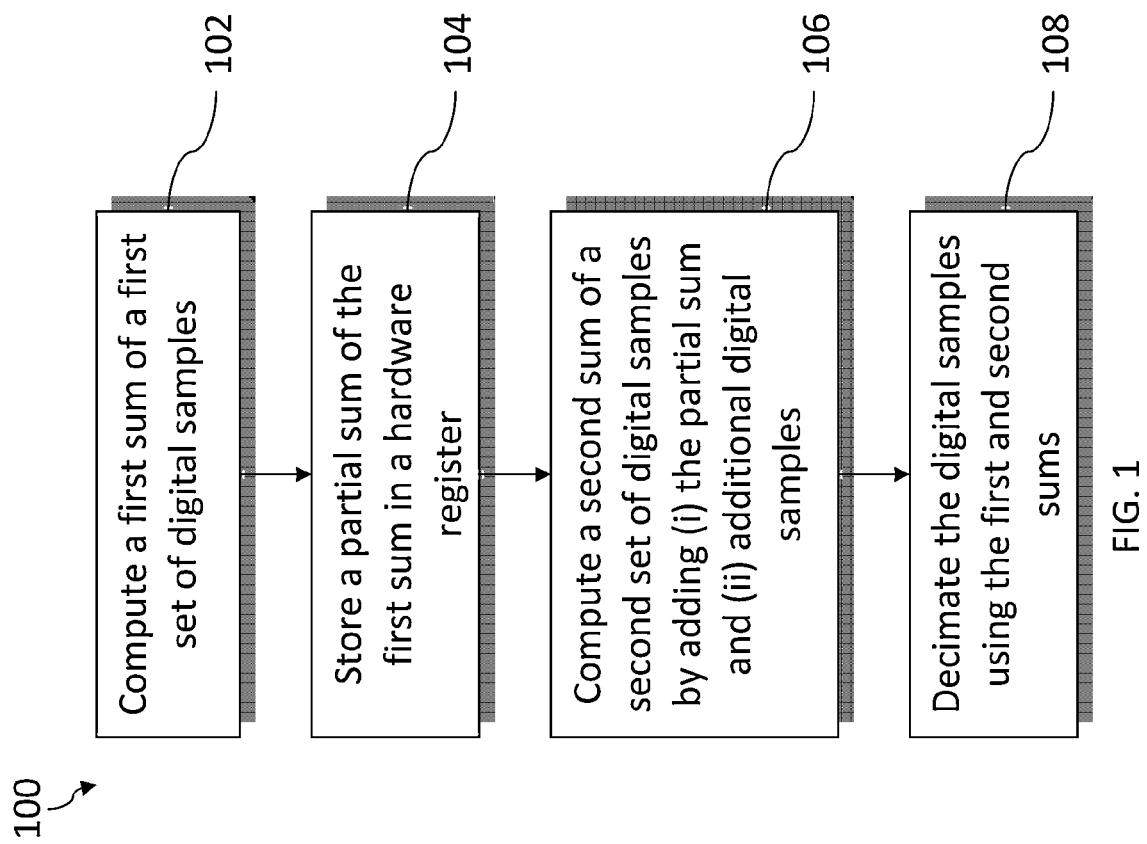
FIG. 1 is a flowchart for downsampling a stream of digital data in accordance with an embodiment of the invention.

A method 100 for downsampling digital samples, in accordance with embodiments of the present invention, appears in FIG. 1. In a first step 102, a first set of digital samples is received and the sum of the samples is computed. As explained in greater detail below, this sum is used to compute the average of these samples (by, e.g., an averaging filter) and the result is one of the set of decimated output points. The number of samples used to compute each sum (and later, to compute each average), N, may correspond to the size (i.e., number of "taps") of the averaging filter (and may thus remain constant throughout the downsampling operation 100). As one of skill in the art will understand, the current invention is not limited to any particular filter size/tap number N.

In a second step 104, a part of the computed sum is stored in a hardware register. Further information about the digital samples (i.e., their values) need not be saved or retained, thus reducing the memory requirements of the downsampling operation 100. In other words, the method 100 saves partial sums of samples instead of the samples themselves.

In a third step 106, a second sum of a second set of digital samples is computed. The first and second sets of digital samples "overlap"—that is, share some samples in common—and the partial sum of the first set of samples saved in step 104 corresponds to this overlapping section. Instead of saving the first set of samples and re-computing the sum of the overlapping section, the method 100 saves the partial sum and adds it to the new, non-overlapping section of the second set of samples.

In a fourth step 108, the input digital samples are decimated using the first and second sums. As explained in greater detail below, the first and second sums may be just two of a great many sums computed. The number of samples included in each sum, which samples are included in which sums, and the number of sums are all design parameters that depend on the decimation ratio, the filter size N, and/or other design parameters.

Figure 2:
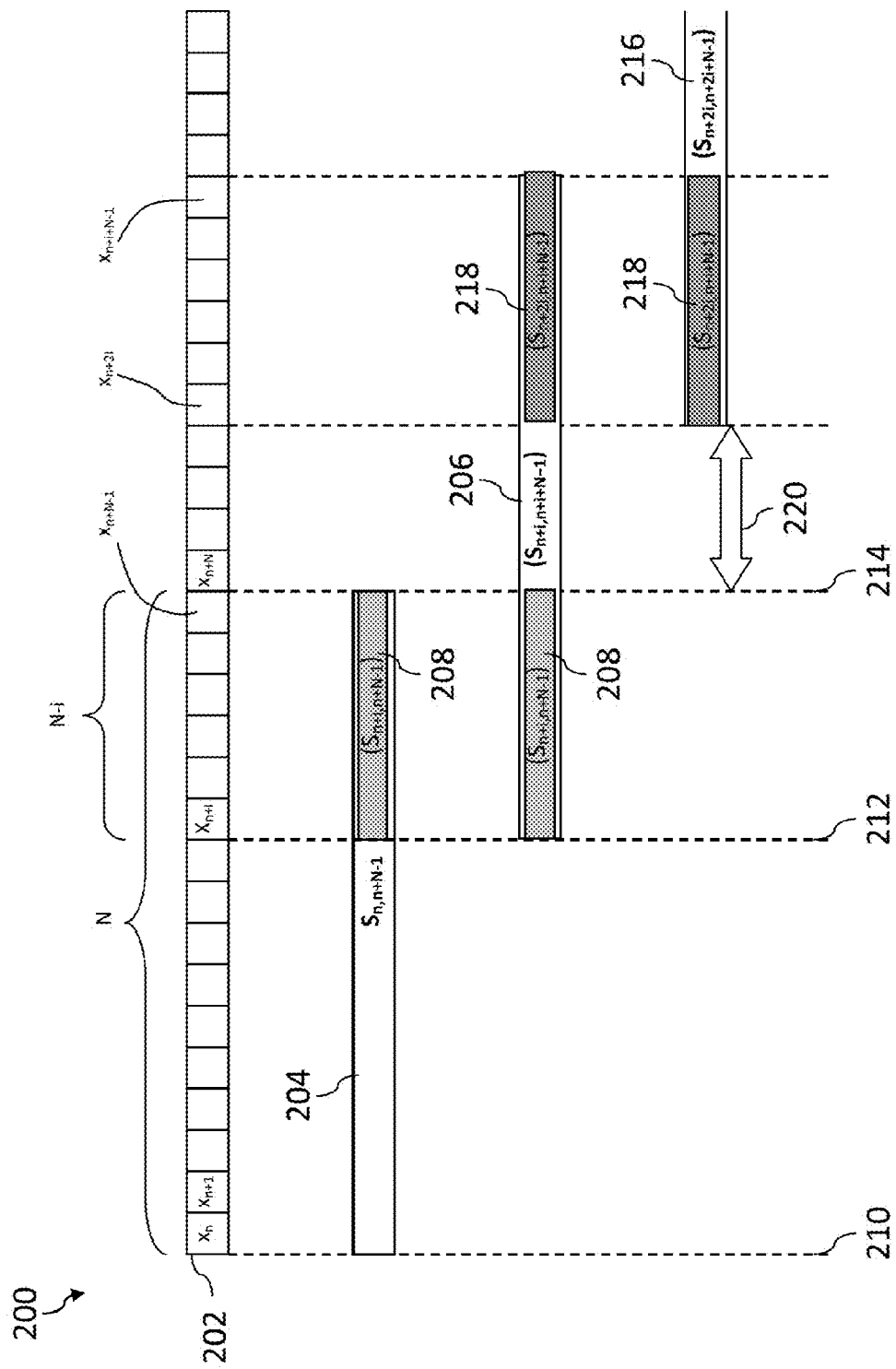
FIG. 2 is a representation of downsampling a stream of digital data in accordance with an embodiment of the invention.

A graphical representation 200 of one embodiment of the method 100 is shown in FIG. 2. An incoming stream of digital samples 202 begins with a first sample $x_n$ and includes, N samples later, a second sample $x_m$ (i.e., m=n+N−1), shown in FIG. 2 as $x_{n+N-1}$. The first sum 204 of the first set of N samples $x_n \ldots x_m$ is $S_{n,m}$, shown in FIG. 2 as $S_{n,n+N-1}$; a second sum 206 of a second set of N samples overlaps the first sum 204 by p samples (p=N−i) in an overlapping region 208. The beginning of the overlapping region is thus p samples less than the end $x_m$ of the first sum 204 and may be represented by $x_{(m-p)}$, shown in FIG. 2 as $x_{n+i}$. The second sum 206 may thus be represented by $S_{n+i,\, n+i+N-1}$, and the partial sum of the overlapping region 208 is $S_{n+i,n+N-1}$.

At a first time 210, at the beginning of the digital samples 202, the samples 202 are added to the first sum $S_{n,n+N-1}$ 204 (and may be discarded after said addition). At a second, later time 212, the overlapping region 208 is reached. At this point, the partial sum $S_{n+i,n+N-1}$ 208 is computed and saved separately from the first sum $S_{n,n+N-1}$ 204. The entire first sum $S_{n,n+N-1}$ 204 may be saved or only the non-overlapping part of it (i.e., $S_{n,n+i-1}$) may be saved; the invention is not limited to any particular type of storage.

At a still later time 214, no further samples are required for the first sum 204. The partial sum 208 is added to the second sum 206, and additional samples 202 are added as necessary to the second sum 206. As FIG. 2 illustrates, the N samples of the first sum 204 are not needed to compute the second sum 206; only the partial sum 208 need be stored. The process continues with a third sum $S_{n+2i,\, n+2i+N-1}$ 216 having an overlapping region $S_{n+2i,\, n+i\ N-1}$ 218, and additional sums and additional overlapping regions are computed in a similar manner.

The three sums 204, 206, 216 may be used to compute three output points $y_1, y_2, y_3$ by dividing each of the sums 204, 206, 216 by N. In this very simple example, the decimation factor is given by the frequency of the computation of the sums; if, for example, a new sum is computed for every ten input samples, the decimation factor is ten.

Figure 3:
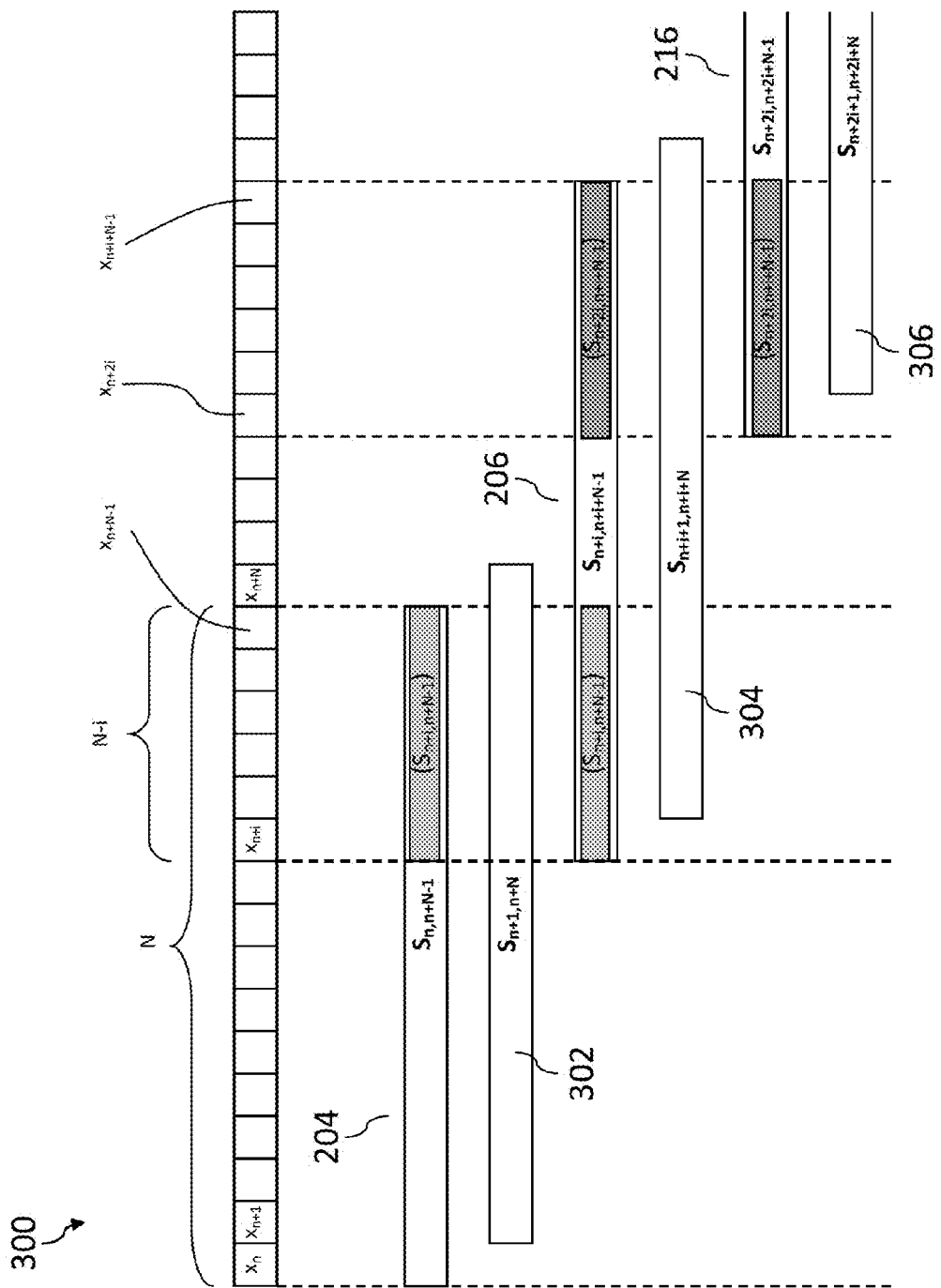
FIG. 3 is another representation of downsampling a stream of digital data in accordance with an embodiment of the invention.

A more sophisticated decimation scheme 300 is depicted in FIG. 3. In addition to the first 204, second 206, and third 216 sums described above with reference to FIG. 2, the scheme 300 takes additional sums 302, 304, and 306. Each pair of sums (the first sum 204 and the first additional sum 302; the second sum 206 and the second additional sum 304; and the third sum 216 and the third additional sum 206) is bilinerally interpolated to produce each output point $y_1, y_2, y_3$.

Each additional sum 302, 304, 306 has the same number of samples (i.e., N) as the first 204, second 206, and third 216 sums, but is shifted by one sample (i.e., the first additional sum 302 is $S_{n+1,n+N}$, the second additional sum 304 is $S_{n+i+1,\ n+i+N}$, and the third additional sum 306 is $S_{n+2i+1,\ n+2i+N}$. Each additional sum 302, 304, 306 may therefore be derived from the first 204, second 206, and third 216 sums by subtracting out the first sample (e.g., $x_n$) and adding in the next sample (e.g., $x_{n+N}$). This first sample may be stored for each additional sum 302, 304, 306 (along with the partial sums 208, 218) so that it is available.

If a decimation scheme requires higher-order (e.g., third-order) interpolation, additional sums may be taken and additional input data samples may be stored to compute those sums. For example, the above method describes interpolating between two sums, $S_{n,n+N-1}$ and $S_{n+1,n+N}$, which in one embodiment stores the input sample $x_n$. If a third-order interpolation is desired, a third sum $S_{n+2,\,n+N+1}$, may be computed by additionally storing $x_{(n+1)}$. Similarly, if bilinear interpolation is used, but the additional sum is shifted by two or more samples, additional samples may be stored to compute the second sum. For example, if the first sum is $S_{n,n+N-1}$ and the second sum is $S_{n+2,\,n+N+1}$ $S_{(n+2),(m+2)}$, both $x_n$ and $x_{(n+1)}$ (or their sum) may be stored.

Figure 4:
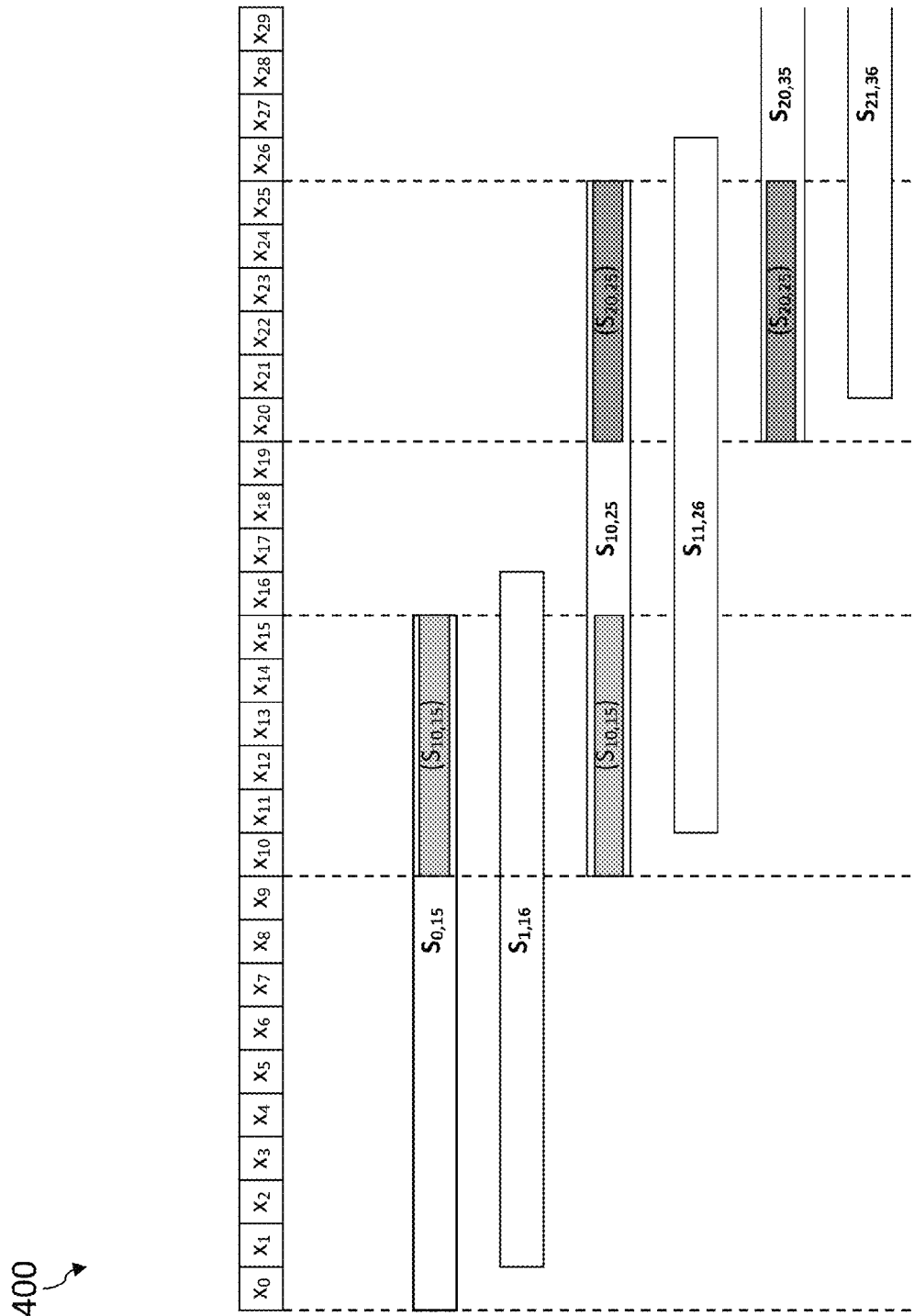
FIG. 4 is an illustrative example of downsampling a stream of digital data in accordance with an embodiment of the invention.

An illustrative example 400 of one embodiment of the invention is shown in FIG. 4. In this example, the averaging filter has sixteen taps, so N=16. The decimation factor is 10.3, meaning that for every 103 input samples x, 10 output samples y are produced. The method uses bilinear interpolation of sums produced by the averaging filter to calculate the output samples y. For example, filter outputs $y_0$ and $y_1$ are interpolated to make a first final output point, $y_{10}$ and $y_{11}$ are interpolated to make a second, $y_{20}$ and $y_{21}$ a third, $y_{30}$ and $y_{31}$ a fourth, and $y_{41}$ and $y_{42}$ a fifth (note that the coordinates of the fifth output point (41 and 42) are shifted by one, with respect to the trend in the rest of the output points (0, 10, 20, 30, etc.) to account for the "0.3" part of the "10.3" decimation factor). Each output y of the averaging filter is based on an average of sixteen input points (because N=16). The filter outputs $y_0$, $y_{10}$, $y_{20}$, $y_{30}$, and $y_{41}$ are given below by Equations (6)-(10).

$$y_0 = \frac{1}{N} S_{0,15} \quad (6)$$

$$y_{10} = \frac{1}{N} S_{10,25} \quad (7)$$

$$y_{20} = \frac{1}{N} S_{20,35} \quad (8)$$

$$y_{30} = \frac{1}{N} S_{30,45} \quad (9)$$

$$y_{41} = \frac{1}{N} S_{41,56} \quad (10)$$

The sums appearing in Equations (6)-(10) may be found in accordance with Equations (11)-(15), which highlight the partial sums re-used in each sum. For example, the partial product $S_{10,15}$ appears in Equations (11) and (12), the partial product $S_{20,25}$ appears in Equations (12) and (13), the partial product $S_{30,35}$ appears in Equations (13) and (14), and the partial product $S_{41,45}$ appears in Equations (14) and (15).

$$S_{0,15} = S_{0,9} + S_{10,15} \quad (11)$$

$$S_{10,25} = S_{10,15} + S_{16,19} + S_{20,25} \quad (12)$$

$$S_{20,35} = S_{20,25} + S_{26,29} + S_{30,35} \quad (13)$$

$$S_{30,45} = S_{30,35} + S_{36,40} + S_{41,45} \quad (14)$$

$$S_{41,56} = S_{41,45} + S_{46,50} + S_{51,56} \quad (15)$$

And as described above, the rest of the sums $S_{1,16}$, $S_{11,26}$, $S_{21,36}$, $S_{31,46}$, and $S_{42,57}$ may be found by subtracting out the "oldest" sample from the corresponding above sums and adding in the next sample, as given below in Equations (16)-(20)

$$S_{1,16} = S_{0,15} - x_0 + x_{16} \quad (16)$$

$$S_{11,26} = S_{10,25} - x_{10} + x_{26} \quad (17)$$

$$S_{21,36} = S_{20,35} - x_{20} + x_{36} \quad (18)$$

$$S_{31,46} = S_{30,45} - x_{30} + x_{46} \quad (19)$$

$$S_{42,57} = S_{41,56} - x_{41} + x_{57} \quad (20)$$

Thus, for each new sum, only the previous partial sum (e.g., $S_{1,16}$, $S_{11,26}$, $S_{21,36}$, $S_{31,46}$, and $S_{42,57}$) and the previous "oldest" sample (e.g., $x_0$, $x_{10}$, $x_{20}$, $x_{30}$, and $x_{41}$) is stored.

The above discussion contemplates a one-dimensional stream of input data samples, such as samples corresponding to an audio signal. The digital samples may, however, correspond to a two-dimensional digital image or video stream (received in, for example, raster order). In this case, instead of saving a single partial sum, a number of partial sums corresponding to one line of the image/video is stored. In addition, instead of storing a single "oldest" point, a number of points corresponding to an oldest line of the image/video is stored. As one of skill in the art will understand, embodiments of the current invention may be applied to input data having higher-order dimensions (e.g., third dimension or greater); in each case, the intermediate-sum storage has a dimension one less than that of the input data. For example, one-dimensional input data may use an intermediate sample, two-dimensional input data uses am intermediate one-dimensional array of values, three-dimensional input data uses an intermediate two-dimensional array, and so on.

In one embodiment, the number of taps N of the averaging filter is selected to comply with the desired decimation ratio. If, for example, the number of taps N increases to approximately two times the decimation rate, the partial sums may overlap/intersect. With reference to FIG. 2, this effect occurs when the distance 220 falls to zero. As one of skill in the art will realize, however, increasing N to this point may be unnecessary because the minimum size of N (as required by the Nyquist) frequency) is less than two times the decimation rate.

Figure 5:
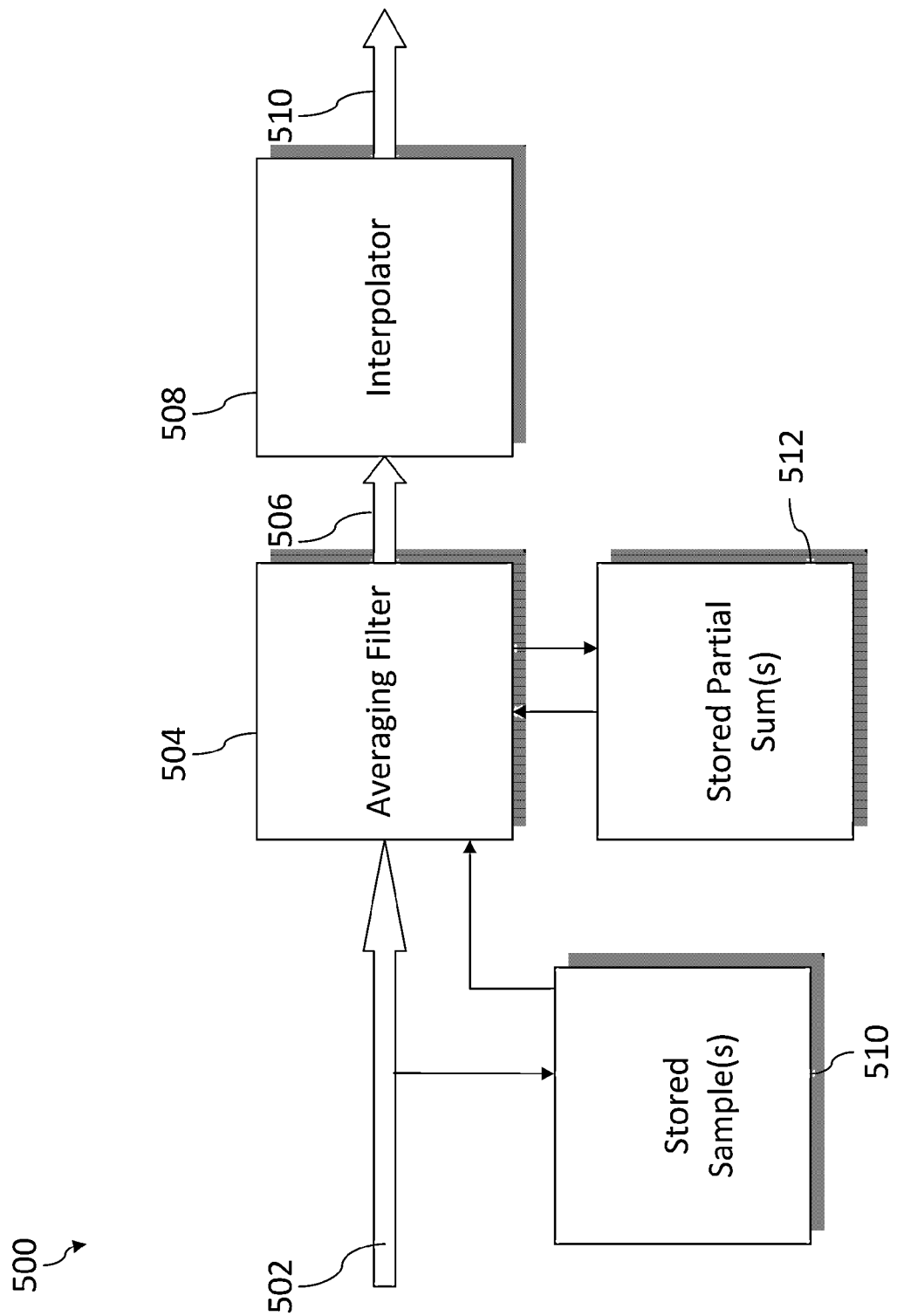
FIG. 5 is a system for downsampling a stream of digital data in accordance with an embodiment of the invention.

A system 500 for downsampling signals is shown in FIG. 5. An incoming stream of data 502, having a high sample rate, is received by an averaging filter 504. The filter 504 provides a series of averaged filter outputs 506 to an interpolator 508; the interpolator 508, in turn, interpolates between two or more filter outputs 506 to provide a final output 510. A first memory 510 stores one or more "oldest" sample points that may be used to compute sums derived from already-computed sums. A second memory 512 stores partial sums for use in computing sums of the input data 502. In various embodiments, the filter 504 and the interpolator 508 may be digital-logic devices implemented with, for example CMOS transistors, and may be custom-tailored devices, part of an ASIC design, or software modules implemented on a conventional processor (such as a digital-signal processor) programmed to carry out the operations described above. The memories 510, 512 may be any kind of volatile or non-volatile storage media, such as random-access memory, a register file, or custom registers. One of skill in the art will understand that the present invention is not limited to the particular combination of components in FIG. 5, and that the components may be combined or further split apart without deviating from the intent of the invention. The memories 510, 512, for example, may be combined.

It should also be noted that embodiments of the present invention may be provided as one or more computer-readable programs embodied on or in one or more articles of manufacture. The article of manufacture may be any suitable hardware apparatus, such as, for example, a floppy disk, a hard disk, a CD ROM, a CD-RW, a CD-R, a DVD ROM, a DVD-RW, a DVD-R, a flash memory card, a PROM, a RAM, a ROM, or a magnetic tape. In general, the computer-readable programs may be implemented in any programming language. Some examples of languages that may be used include C, C++, or JAVA. The software programs may be further translated into machine language or virtual machine instructions and stored in a program file in that form. The program file may then be stored on or in one or more of the articles of manufacture.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A method for a processor to computationally downsample digital samples $x_n, x_{n+1}, \ldots$ of a signal by a decimation factor d, the method comprising using the processor to perform:
   based on the decimation factor d and a number N of taps of an averaging filter to use for the downsampling, identifying a partial sum to use for the downsampling, wherein the partial sum is identified as a sum $S_{n+i,n+N-1}$ of (N−i) samples $x_{n+i}, \ldots x_{n+N-1}$, wherein i is an integer portion of the decimation factor d;
   computing the partial sum $S_{n+i,n+N-1}$;
   storing the computed partial sum $S_{n+i,n+N-1}$ in a hardware register;
   computing a first sum $S_{n,n+N-1}$ of a first set of N digital samples $x_n, \ldots x_{n+N-1}$ as a sum of a set of i digital samples $x_n, \ldots x_{n+i-1}$ and the computed partial sum $S_{n+i,n+N-1}$;
   computing a second sum $S_{n+i,n+i+N-1}$ of a second set of N digital samples $x_{n+i}, \ldots x_{n+i+N-1}$ as a sum of a set of i digital samples $x_{n+N}, \ldots x_{n+i+N-1}$ and the computed partial sum $S_{n+i,n+N-1}$; and
   downsampling the digital samples based at least in part on the first sum $S_{n,n+N-1}$ and the second sum $S_{n+i,n+i+N-1}$.

2. The method of claim 1, further comprising storing a digital sample $x_n$ in a hardware register.

3. The method of claim 2, further comprising computing a third sum $S_{n+1,n+N}$ by subtracting $x_n$ from the first sum $S_{n,n+N-1}$ and by adding another digital sample $x_{n+N}$.

4. The method of claim 3, further comprising computing a fourth sum $S_{n+i+1,n+i+N}$ by subtracting $x_{n+i}$ from the second sum $S_{n+i,n+i+N-1}$ and by adding another digital sample $x_{n+i+N}$.

5. The method of claim 4, wherein the downsampling of the digital samples based at least in part on the first sum $S_{n,n+N-1}$ and the second sum $S_{n+i,n+i+N-1}$ comprises generating a first output digital sample $y_n$ based on an interpolation between the first sum $S_{n,n+N-1}$ and the third sum $S_{n+1,n+N}$, and generating a second output digital sample $y_{n+1}$ based on an interpolation between the second sum $S_{n+i,n+i+N-1}$ and the fourth sum $S_{n+i+1,n+i+N}$.

6. The method of claim 1, wherein N is 16 and the digital samples are downsampled by the decimation factor of 10.3.

7. The method of claim 1, wherein the digital samples correspond to a one-dimensional signal.

8. The method of claim 1, wherein the digital samples correspond to a two-dimensional signal.

9. The method of claim 8, wherein the two-dimensional signal corresponds to raster-scan image data, and wherein the method further comprises storing partial sums corresponding to a row of input data.

10. A system for downsampling digital samples $x_n, x_{n+1}, \ldots$ of a signal by a decimation factor d, the system comprising:
    a processor comprising an averaging filter having N taps where N>1; and
    a second memory for storing a partial sum of two or more digital samples,
    wherein the averaging filter is configured to:
        based on the decimation factor d and a number of the taps of the averaging filter, identify the partial sum to use for the downsampling, wherein the partial sum is identified as a sum $S_{n+i,n+N-1}$ of (N−i) samples $x_{n+i}, \ldots x_{n+N-1}$, wherein i is an integer portion of the decimation factor d,
        compute the partial sum $S_{n+i,n+N-1}$,
        store the computed partial sum $S_{n+i,n+N-1}$ in the second memory,
        compute a first sum $S_{n,n+N-1}$ of a first set of N digital samples $x_n, \ldots x_{n+N-1}$ as a sum of a set of i digital samples $x_n, \ldots x_{n+i-1}$ and the stored partial sum $S_{n+i,n+N-1}$,
        compute a second sum $S_{n+i,n+i+N-1}$ of a second set of N digital samples $x_{n+i}, \ldots x_{n+i+N-1}$ as a sum of a set of i digital samples $x_{n+N}, \ldots x_{n+i+N-1}$ and the stored partial sum $S_{n+i,n+N-1}$,
        compute a first average of N digital samples based on the first sum $S_{n,n+N-1}$, and
        compute a second average of N digital samples based on the second sum $S_{n+i,n+i+N-1}$.

11. The system of claim 10, wherein the digital samples correspond to a one-dimensional signal.

12. The system of claim 10, wherein the digital samples correspond to a two-dimensional signal.

13. The system of claim 10, wherein the two-dimensional signal corresponds to raster-scan image data, and wherein the method further comprises storing partial sums corresponding to a row of input data.

14. The system of claim 10, further comprising a first memory for storing a digital sample $x_n$, wherein the averaging filter is further configured to compute a third sum $S_{n+1,n+N}$ by subtracting the digital sample $x_n$ stored in the first memory from the first sum $S_{n,n+N-1}$ and by adding another digital sample $x_{n+N}$.

15. The system of claim 14, wherein the averaging filter is further configured to compute a third average of N digital samples based on the third sum $S_{n+1,n+N}$, the system further comprising an interpolator for interpolating between the first average and the third average.

16. A system for computationally downsampling digital samples $x_n, x_{n+1}, \ldots$ of a signal by a decimation factor d, the system comprising:
    means for, based on the decimation factor d and a number N of taps of an averaging filter to use for the downsampling, identifying a partial sum to use for the downsampling, wherein the partial sum is identified as a sum $S_{n+i,n+N-1}$ of (N−i) samples $x_{n+i}, \ldots x_{n+N-1}$, wherein i is an integer portion of the decimation factor d;

means for computing the partial sum $S_{n+i,n+N-1}$;

means for storing the computed partial sum $S_{n+i,n+N-1}$ in a hardware register;

means for computing a first sum $S_{n,n+N-1}$ of a first set of N digital samples $x_n, \ldots x_{n+N-1}$ as a sum of a set of i digital samples $x_n, \ldots x_{n+i-1}$ and the computed partial sum $S_{n+i,n+N-1}$;

means for computing a second sum $S_{n+i,n+i+N-1}$ of a second set of N digital samples $x_{n+i}, \ldots x_{n+i+N-1}$ as a sum of a set of i digital samples $x_{n+N}, \ldots x_{n+i+N-1}$ and the computed partial sum $S_{n+i,n+N-1}$; and means for downsampling the digital samples based at least in part on the first sum $S_{n,n+N-1}$ and the second sum $S_{n+i,n+i+N-1}$.

17. The system of claim 16, further comprising means for storing a digital sample $x_n$ in a hardware register and means for computing a third sum $S_{n+1,n+N}$ by subtracting $x_n$ from the first sum $S_{n,n+N-1}$ and by adding another digital sample $x_{n+N}$.

18. The system of claim 16, wherein the digital samples correspond to a one-dimensional signal.

19. The system of claim 16, wherein the digital samples correspond to a two-dimensional signal.

20. The system of claim 19, wherein the two-dimensional signal corresponds to raster-scan image data, and wherein the system further comprises means for storing partial sums corresponding to a row of input data.

21. A non-transitory computer readable storage medium storing one or more computer readable instructions which, when executed on a processor, configure the processor to carry out a method for computationally downsampling digital samples $x_n, x_{n+1}, \ldots$ of a signal by a decimation factor d, the method comprising:

based on the decimation factor d and a number N of taps of an averaging filter to use for the downsampling, identifying a partial sum to use for the downsampling, wherein the partial sum is identified as a sum $S_{n+i,n+N-1}$ of (N−i) samples $x_{n+i}, \ldots x_{n+N-1}$, wherein i is an integer portion of the decimation factor d;

computing the partial sum $S_{n+i,n+N-1}$;

storing the computed partial sum $S_{n+i,n+N-1}$ in a hardware register;

computing a first sum $S_{n,n+N-1}$ of a first set of N digital samples $x_n, \ldots x_{n+N-1}$ as a sum of a set of i digital samples $x_n, \ldots x_{n+i-1}$ and the computed partial sum $S_{n+i,n+N-1}$;

computing a second sum $S_{n+i,n+i+N-1}$ of a second set of N digital samples $x_{n+i}, \ldots x_{n+i+N-1}$ as a sum of a set of i digital samples $x_{n+N}, \ldots x_{n+i+N-1}$ and the computed partial sum $S_{n+i,n+N-1}$; and downsampling the digital samples based at least in part on the first sum $S_{n,n+N-1}$ and the second sum $S_{n+i,n+i+N-1}$.

22. The non-transitory computer readable storage medium of claim 21, wherein the method further comprises storing a digital sample $x_n$ in a hardware register and computing a third sum $S_{n+1,n+N}$ by subtracting $x_n$ from the first sum $S_{n,n+N-1}$ and by adding another digital sample $x_{n+N}$.

23. The non-transitory computer readable storage medium of claim 21, wherein the digital samples correspond to a one-dimensional signal.

24. The non-transitory computer readable storage medium of claim 21, wherein the digital samples correspond to a two-dimensional signal.

25. The non-transitory computer readable storage medium of claim 24, wherein the two-dimensional signal corresponds to raster-scan image data, and wherein the method further comprise storing partial sums corresponding to a row of input data.

* * * * *